United States Patent [19]
Lai et al.

[11] Patent Number: 5,249,971
[45] Date of Patent: Oct. 5, 1993

[54] IC PACKAGE CONNECTOR

[75] Inventors: Vincent Lai; J. J. Hsu, 930 W. Maude Ave., both of Sunnyvale, Calif. 94086

[73] Assignee: Foxconn International, Inc., Sunnyvale, Calif.

[21] Appl. No.: 12,615

[22] Filed: Feb. 2, 1993

Related U.S. Application Data

[63] Continuation of Ser. No. 754,080, Sep. 13, 1991, abandoned.

[51] Int. Cl.⁵ .............................................. H01R 9/09
[52] U.S. Cl. ...................................... 439/70; 439/525
[58] Field of Search ...................................... 439/68–73, 439/264, 525, 526, 862

[56] References Cited

U.S. PATENT DOCUMENTS

| | | | |
|---|---|---|---|
| 33,268 | 7/1990 | Grabbe et al. | 439/70 |
| 4,679,871 | 7/1987 | Egawa | 439/70 |
| 4,746,299 | 5/1988 | Matmoka et al. | 439/70 |
| 4,934,944 | 6/1990 | Kozel et al. | 439/68 |

Primary Examiner—Larry I. Schwartz
Assistant Examiner—Hien D. Vu
Attorney, Agent, or Firm—John J. Leavitt

[57] ABSTRACT

Disclosed is a connector for connecting an IC package to a printed circuit board (PCB). The connector includes a base; a wall perpendicular to and surrounding the bottom base to form a recess for accommodating the IC package, the wall having a plurality of slots formed on the inner side thereof and lining up side-by-side therealong; a plurality of terminals, each of which is fitted within one of the slots, for electrically connecting the pins of the IC package to the printed circuit board. Each terminal is formed by bending a conducting strip into substantially four portions including: a securing portion to be inserted into a securing groove in the slot to secure the terminal therein; a mounting portion to be attached to the PCB by using a surface mounting technique; a first contact portion positioned over the mounting portion and contacting the pin of the IC package at a first lower point; and a second contact portion extending generally upwards from the first contact portion with a slight inclination towards the recess and contacting the pin of the IC package at a second upper point for conducting contact with the pin and to exert a downward and inward directed force upon the pin so as to retain the IC package within the connector.

2 Claims, 7 Drawing Sheets

IC PACKAGE CONNECTOR

This is a continuation of copending application Ser. No. 07/754,080 filed on Sep. 13, 1991, now abandoned.

BACKGROUND OF THE INVENTION

1. Field of the Invention

The present invention relates to a connector, and more particularly, to a connector for electrically connecting an IC package to a printed circuit board (PCB).

2. Description of the Related Art

A conventional IC package connector will be described by referring to FIGS. 5, 6, 7 and 8. The prior connector provides a good result in electrically connecting the IC package to a PCB (printed circuit board). However, it still suffers from some drawbacks encountered in manufacture, assembly, and application. The primary object of the present invention is therefore directed essentially to overcome the drawbacks encountered in this prior connector.

As shown in FIGS. 5 and 6, the prior connector includes a body 1, a first group of terminals 2A, a second group of terminals 2B, and a spacing plate 3. The spacing plate 3 has, parallel to its each edge, a first row of outer through holes 31A, having a pitch 2p, for the legs 21A, 21B of the terminals 2A, 2B to pass therethrough. As shown in FIG. 7, the body 1 comprises a square base 10, and a wall 11 perpendicular to and surrounding the base 10. The base 10 and the wall 11 jointly form a recess 12. An IC package 4 may be mounted onto the connector by inserting it into the recess 12. A plurality of parallel slots 14, having a pitch p, are formed on the inner side of the wall 11 for accommodating the terminals 2A and 2B therein.

As can be seen in FIGS. 5 through 8, the two groups of terminals 2A and 2B are of different types. Referring particularly to FIG. 8 which shows a state when an IC package 4 is inserted into the recess 12 in the body 1 of the IC package connector, each terminal 2A comprises a contact portion 22A received in a slot 14, and a leg 21A inserted through an outer through hole 31A of the spacing plate 3 into a corresponding one of a plurality of first insertion holes 51A which are formed in the PCB 5 by a pitch 2p. Similarly, each terminal 2B comprises a contact portion 22B which is received in a slot 14 and is adapted to contact and retain the IC package 4 in position, and a leg 21B inserted through an inner through hole 31B of the spacing plate 3 into a corresponding one of a plurality of second insertion holes 51B which are formed in the PCB 5 by a pitch 2p. Two groups of terminals 2A and 2B are inserted into the slots 14 in the same row by two separate insertion operations so as to interpose each terminal 2A between two terminals 2B, and vice versa, and to arrange the contact portions 22A and 22B of the terminals 2A and 2B substantially in a straight line parallel to the edge of the body 1 (see FIG. 8). Each contact portion 22A (or 22B) of the terminal 2A (or 2B) contacts a pin 41 of the IC package 4 at a point P and exerts a slight pressing force upon the pin 41 so as to retain the IC package 4 in position within the connector.

In the above-described prior connector, two different types of terminals 2A and 2B must be prepared. Besides, prior to engaging the connector with the PCB, a plurality of insertion holes 51A and 51B must be formed in the PCB. In addition, during the assembling process, the two group of terminals 2A and 2B to be received in the same row of slots 14 must be separately inserted in the slots 14 by two steps, namely by first inserting the first group of terminals 2A into, for example, the odd-numbered slots in the row, and then inserting the second group of terminals 2B into the even-numbered slots 14 in the same row. Furthermore, since those terminals 2A to be fitted into only the odd-numbered (or even-numbered) slots 14 in the same row are integrally formed in a row on the same piece of material by press work to facilitate manufacture, storage and assembly, the pitch of the row of terminals 2A must be twice ($2p$) as large as the pitch p of the row of slots 14, which necessarily increases the amount of material required for forming the terminals. Consequently, the prior connector is material-consuming, time-consuming in manufacture, and labor-consuming in assembly, and thus is inevitably high in its manufacturing cost. On the other hand, if we try to solve the above problems of prior connector by preparing only one type of terminals, then the corresponding insertion holes must be closely formed in the PCB by a small pitch p which is not desirable based on strength considerations.

Another drawback of the above-described prior connector resides in that each terminal 2A (or 2B) contacts the pin of the IC package only at one point P. Therefore, the electrical connection between them may not be well assured. Further, the distance of the conducting path from the contact point P to the leg of the terminal, particularly to the leg 21B of the terminal 2B, is too long, which increases the resistance of the conducting path and thus the electrical energy dissipation.

SUMMARY OF THE INVENTION

It is, therefore, the primary object of the present invention to provide an improved IC package connector which can avoid the drawbacks encountered in the foregoing described prior connector.

A connector according to the present invention comprises a base; a wall perpendicular to and surrounding the base to form a recess for accommodating a IC package, the wall having a plurality of slots formed on the inner side thereof and lining up side-by-side therealong; a plurality of terminals, each of which is securely fitted within one of the slots, for electrically connecting the pins of the IC package to the printed circuit board. This connector is characterized by a specially shaped terminal which is formed by bending a conducting strip into substantially four portions including a securing portion adapted to secure the terminal to the connector; a mounting portion adapted to mount the connector to the printed circuit board by making use of a surface mounting technique; a first and a second contact portions adapted to contact the pins of the IC package.

BRIEF DESCRIPTION OF THE DRAWING

The present invention can be more fully understood by reference to the following detailed description and accompanying drawings, which form an integral part of the present invention.

DETAILED DESCRIPTION OF A PREFERRED EMBODIMENT

A detailed description of a preferred embodiment according to the present invention is now made with reference to FIGS. 1, 2, 3 and 4.

Figure 1:
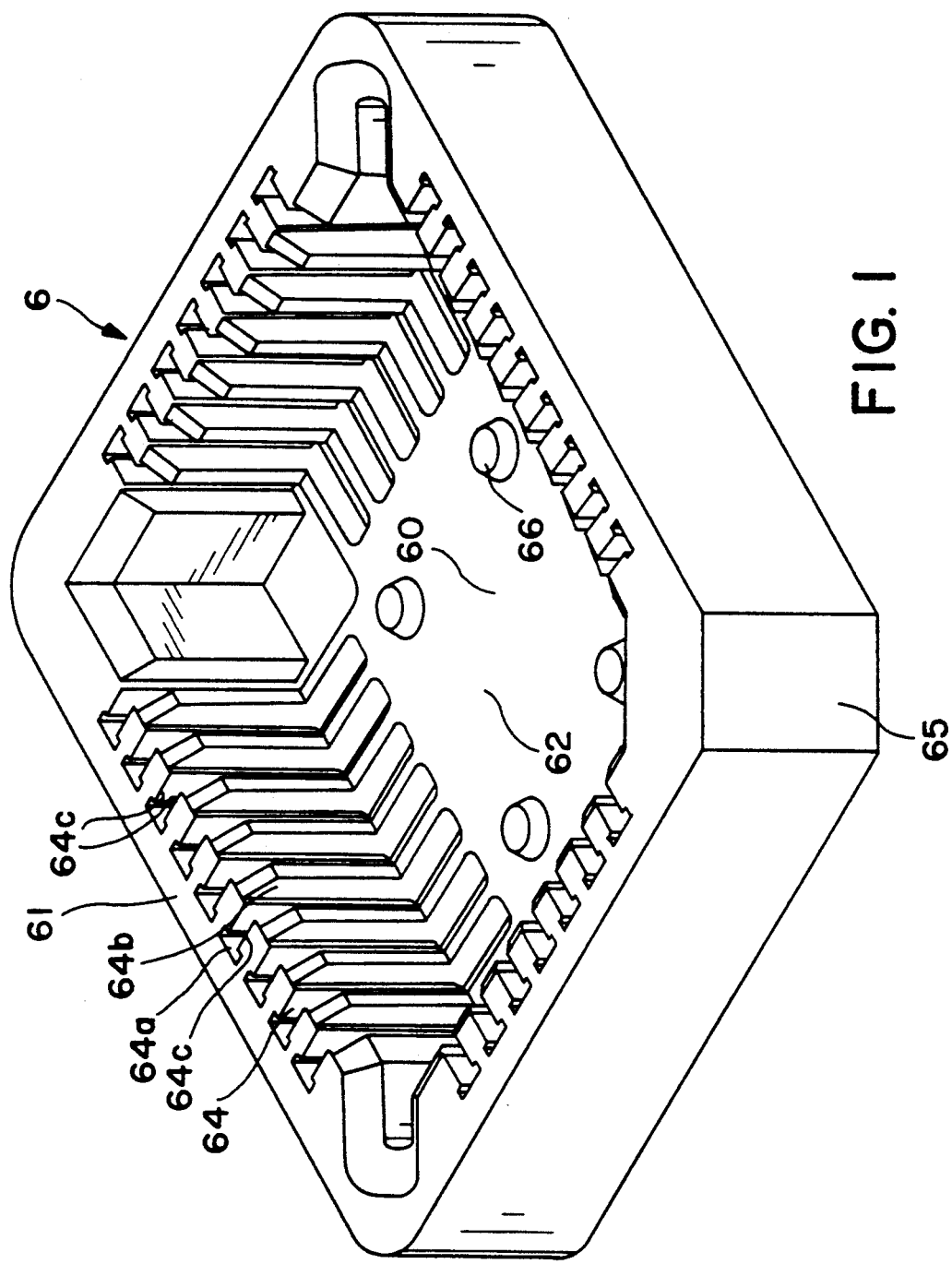
FIG. 1 is a perspective view of an IC package connector according to a preferred embodiment of the present invention.

As shown in FIG. 1, the connector 6 comprises a square base 60, and a wall 61 perpendicular to and surrounding the base 60. The base 60 and the wall 61 jointly form a recess 62. An IC package 8 (FIG. 4) may be mounted onto the connector 6 by inserting it into the recess 62. On the inner side of the wall 61 are formed a plurality of slots 64 which are lined up side-by-side along the wall 61. Each of the slots 64 is adapted to securely accommodate therein a terminal 7 (see FIG. 3), and has a substantially I-shaped cross-section including a securing groove 64a, a contact groove 64b adjacent to the recess 62, and a narrower intermediate groove 64c interconnecting the securing groove 64a and the contact groove 64b. An outside corner 65 of the wall 61 is cut off as a mark for indicating the orientation of the connector 6. Furthermore, a plurality of protrusions 66 project from the base 60 into the recess 62 for supporting the IC package 8 spaced above the base 60 (see FIG. 4).

Figure 2:
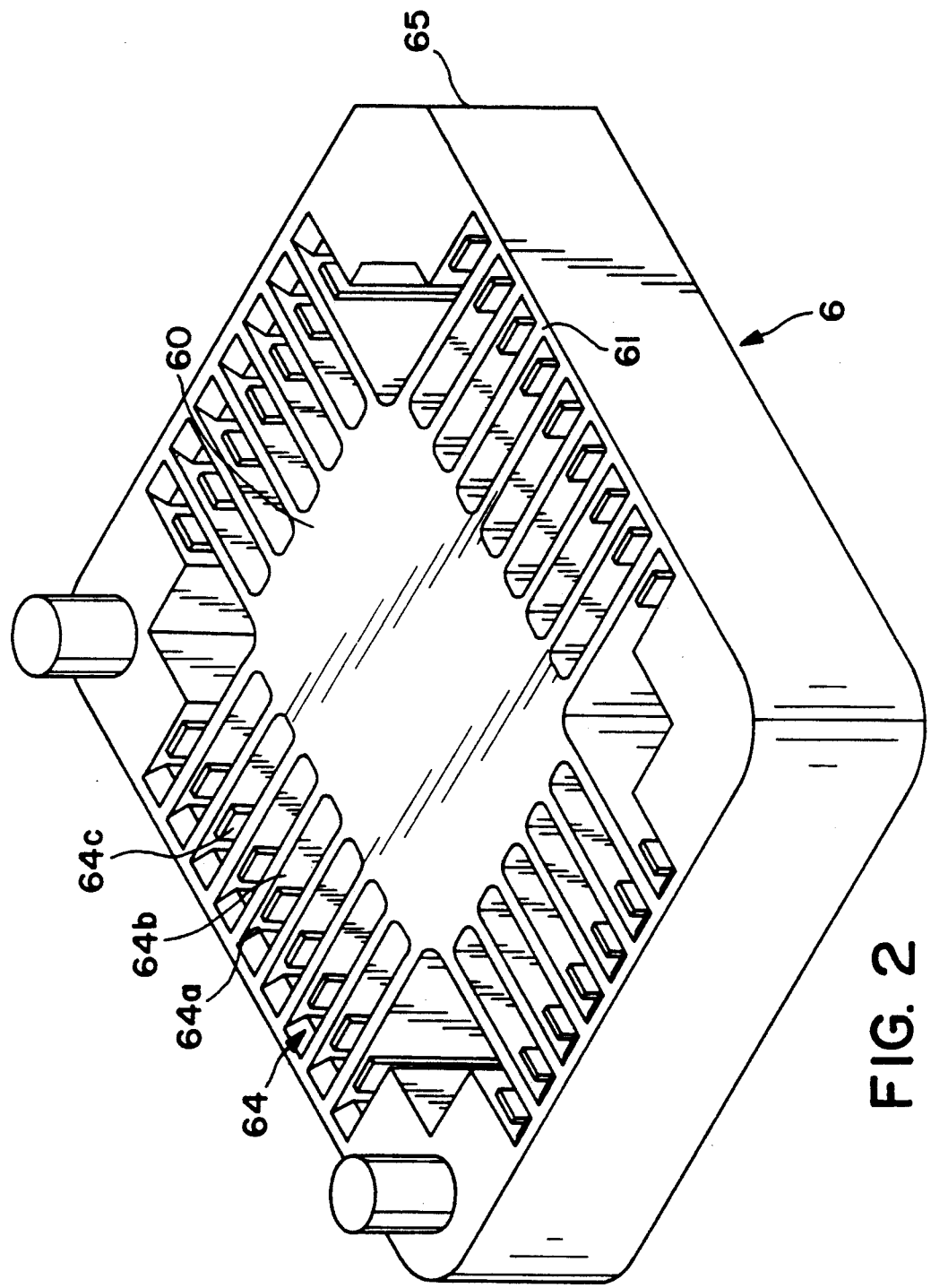
FIG. 2 is another perspective view of the IC package connector shown in FIG. 1, with the connector being turned upside down.

In FIG. 2, the connector 6 is placed upside down to show its bottom portion. From this figure, it can be understood that each slot 64 extends through the bottom portion of the base 60 such that the terminals 7 of the connector can extend through the base of the connector to electrically connect the IC package to a printed circuit board.

Figure 3:
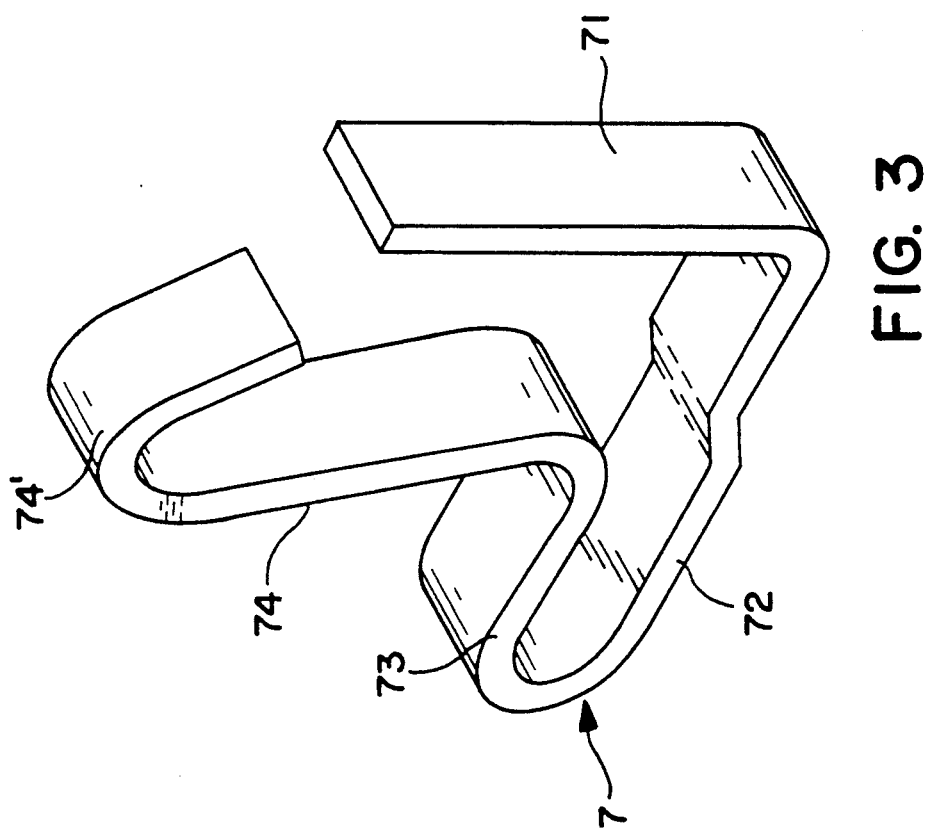
FIG. 3 is an enlarged perspective view of a terminal for the IC package connector.
Figure 4:
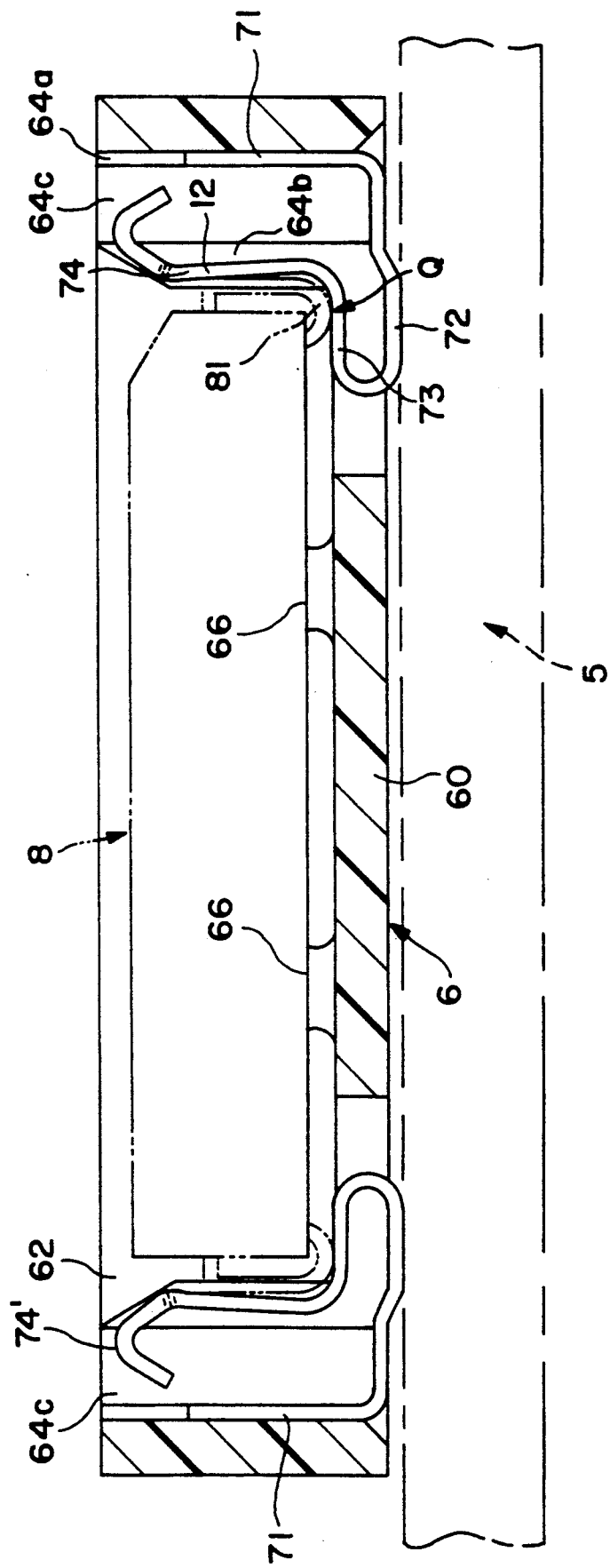
FIG. 4 is a sectional view of the same IC package connector equipped with a terminal as in FIG. 3 and with an IC package inserted therein.
Figure 5:
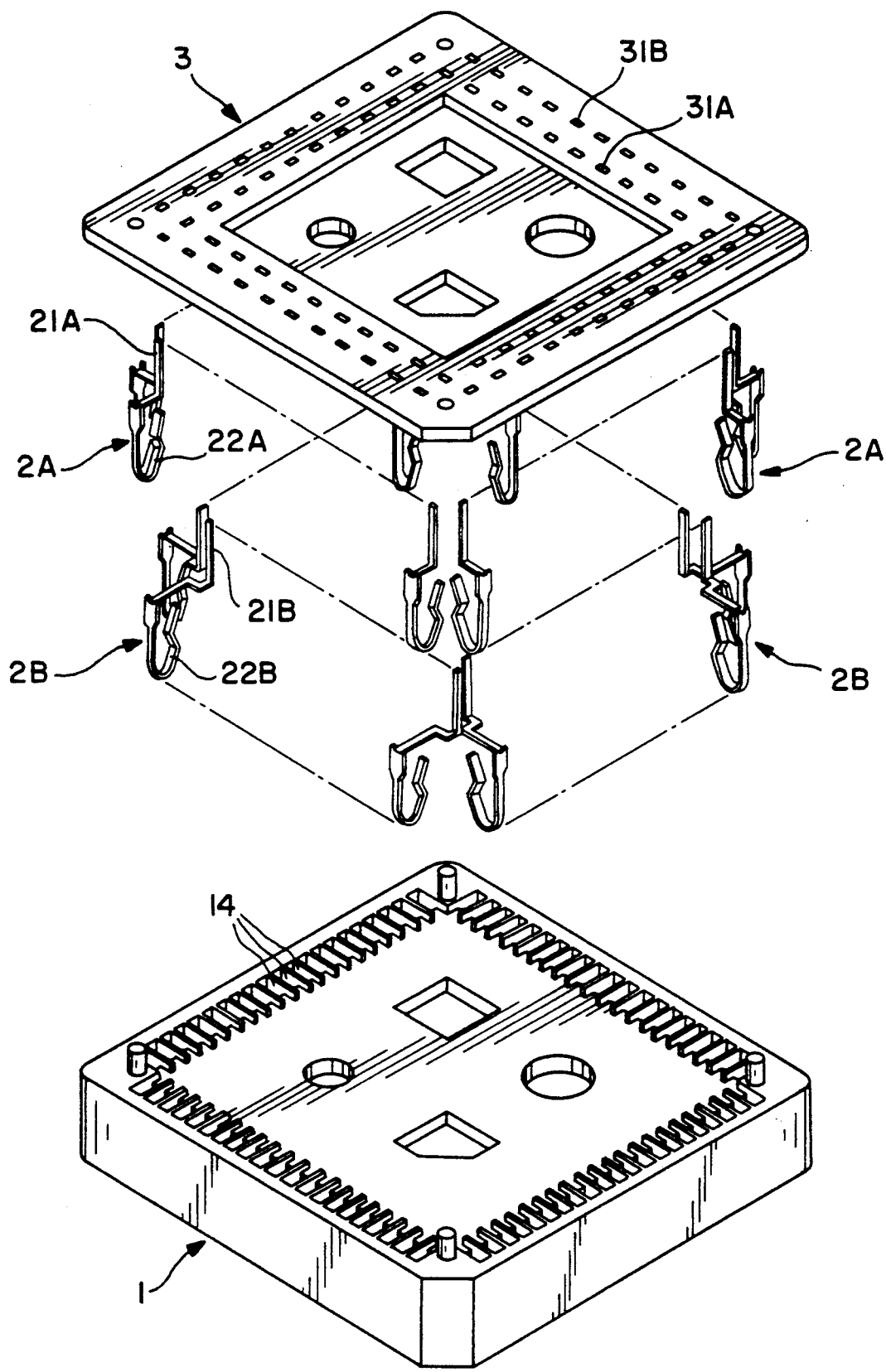
FIG. 5 is an exploded perspective view of a prior art IC package connector.
Figure 6:
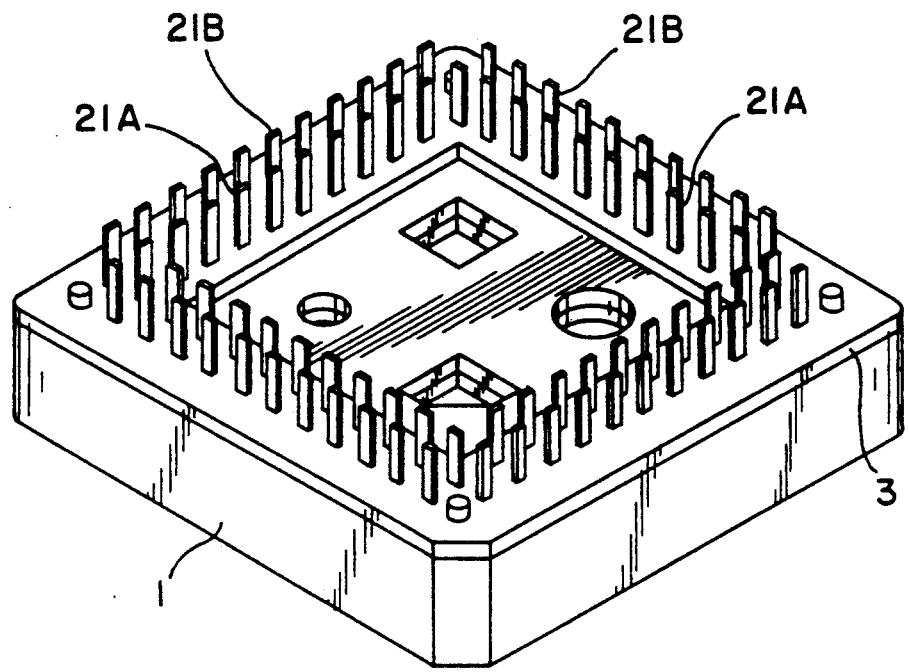
FIG. 6 is an assembled perspective view of the prior art IC package connector shown in FIG. 5.
Figure 7:
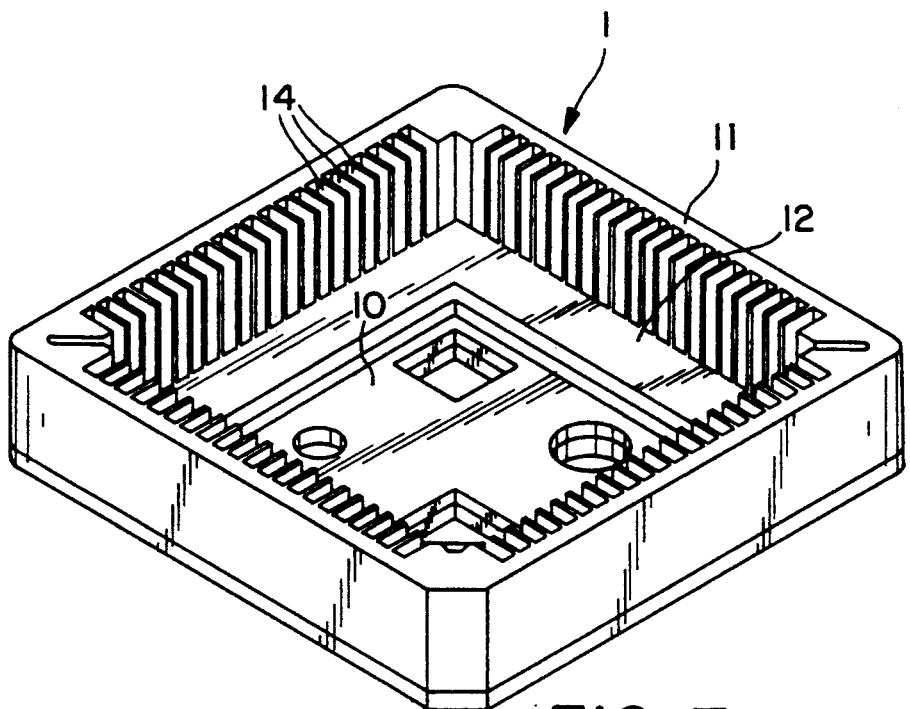
FIG. 7 is another assembled perspective view of the prior art IC package connector in FIG. 6 which is placed upside down to show its bottom portion.
Figure 8:
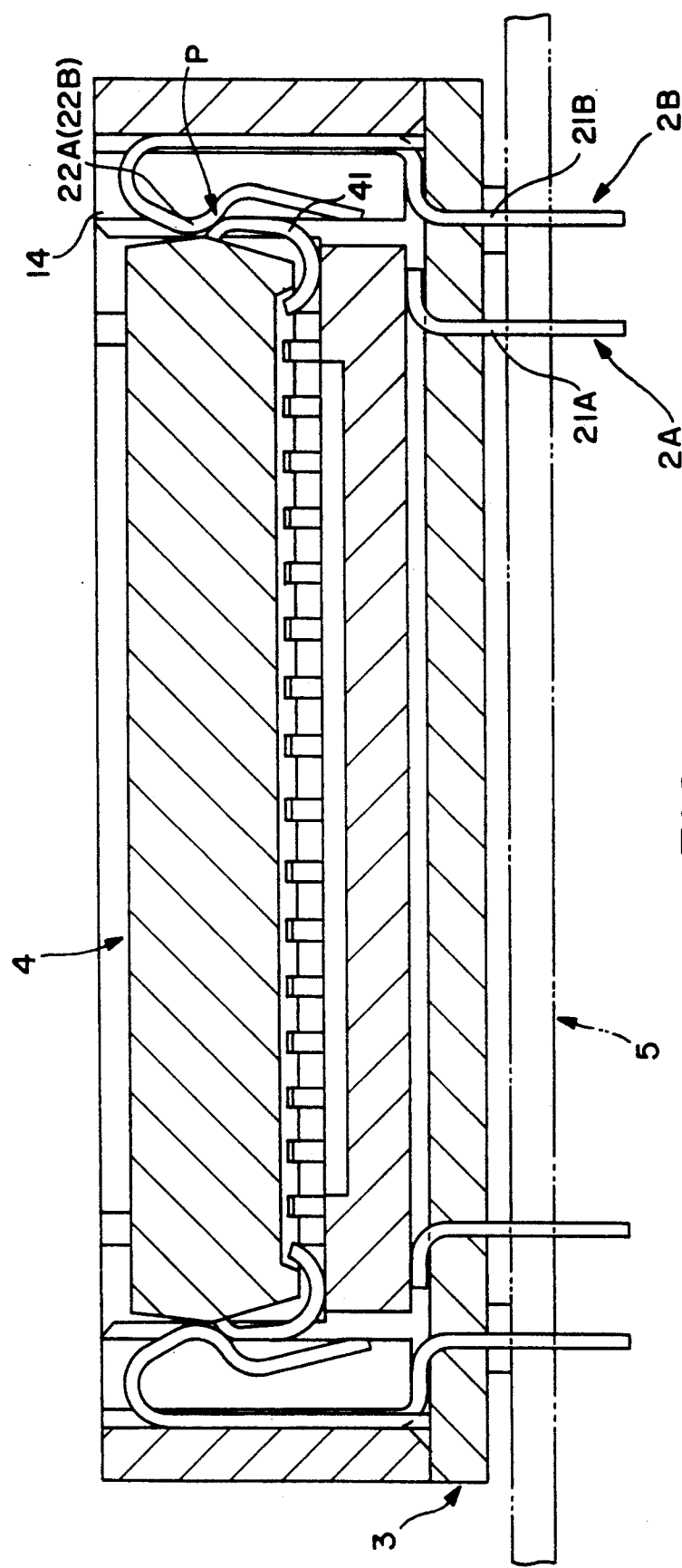
FIG. 8 is a sectional view of the same prior art IC package connector with an IC package inserted therein.

Referring now to FIG. 3, each terminal 7 according to the present invention is formed by bending an elongate thin strip of conductor into a shape as shown in the figure. The thus shaped terminal 7 can be functionally divided into four portions, including a securing portion 71, a mounting portion 72, a first contact portion 73, and a second contact portion 74. From FIGS. 3 and 4, it is found that, in an assembled state, the securing portion 71 is securely fitted into the securing groove 64a of the slot 64 to secure the whole terminal 7 therein. The mounting portion 72 extends, at the bottom of the connector 6, parallel to and in contact with a PCB 5 when the connector 6 is mounted thereon. Subsequently, the connector 6 can be attached to the PCB by using a surface mounting technique. The first contact portion 73 is formed by a U-shaped bend in the strip conductor and is positioned over the mounting portion 72 and when assembled with connector 6 is located at the lower portion of the contact groove 64b. When the IC package 8 is inserted within the connector 6, the lower portion of the IC pin 81 come into contact with the upper surface of the first contact portion 73 at a point Q as shown in FIG. 4. The second contact portion 74 is formed by an integral acute angle extension of the first contact portion and extends generally upwards from the first contact portion 73 with a slight inclination towards the recess 62 and contacts the upper portion of the IC pin 81 at a point R. The inclination of the second contact portion 74 is provided for exerting a downward and inward directed force upon the pins 81 so as to retain the IC package 8 within the connector 6. As previously described, the intermediate narrower groove 64c interconnected the securing groove 64a and the contact groove 64b. Since the securing portion 71, as previously described, is securely fitted into the securing groove 64a, and the upwardly extending second contact portion, as shown, lies within the contact groove 64b, which is wider than the intermediate groove, as illustrated and described, it follows that the U-shaped free end portion 74' of the second contact portion 74 shown in FIG. 4 to project into the narrower intermediate groove 64c must of necessity be narrower than either of the securing portion 71 or the contact portion 74. This narrowed U-shaped free end portion 74' of the second contact portion is illustrated in FIG. 3.

From the above description, it can be readily understood that a connector in accordance with the present invention possesses at least the following advantages over the previously described prior art connector;

1. Only one type of terminals are required for such a connector;

2. All terminals to be received in the same row of slots 64 can be simultaneously formed, by press work, in a row having a pitch identical to the pitch of the slots 64; in other words, the same amount of material can be used to manufacture twice as many terminals as in the case of the prior art connector;

3. All terminals to be received in the same row of slots 64 can be simultaneously inserted into the connector by a single insertion operation rather than two operations as in the case of the prior art connector;

4. No insertion holes need be formed in the PCB, because a surface mounting technique is utilized for mounting the connector onto the PCB;

5. Since each terminal contacts the IC pin 81 of the IC package 8 at two points Q and R, a better electrical conduction can be assured; and 6. Since the conducting path between the pins (point Q) and the PCB are much shorter than in the prior connector, the electrical loss in the conducting paths is much smaller.

Consequently, the connector according to the present invention is material-saving in manufacture, time-saving in manufacture, and labor-saving in assembly, and thus is much lower in its manufacturing cost as compared with the prior art connector.

While the invention has been described by way of example and in terms of a preferred embodiment, it is to be understood that the invention need not be limited to the disclosed embodiment. On the contrary, it is intended to cover various modifications and similar arrangements included within the spirit and scope of the appended claims, the scope of which should be accorded the broadest interpretation so as to encompass all such modifications and similar structures.

What is claimed is:

1. A connector for connecting an IC package having a plurality of pins to a printed circuit board (PCB), comprising;

a base;

a wall perpendicular to and surrounding said base to form a recess for accommodating the IC package, an inner side of said wall having a plurality of slots formed thereon and lined up side by side therealong;

a plurality of terminals, each of which is fitted within one of said slots, for electrically connecting the pins of the IC package to the printed circuit board; characterized in that:

each of said slots has a substantially I-shaped cross section including a securing groove, a contact groove adjacent to said recess, and a narrower intermediate groove interconnecting said securing groove and said contact groove;

each of said terminals is formed by bending a conducting strip into substantially four portions including: a securing portion to be inserted into said securing groove of said slot to secure said terminal therein; a mounting portion, positioned at a bottom of said slot, to be directly attached to the PCB by using a surface mounting technique; a first contact portion positioned over said mounting portion and contacting the respective pin of the IC package at a lower point; and a second contact portion extending generally upwards from said first contact portion with a slight inclination towards said recess and contacting the pin of the IC package at an upper point for conducting contact with the pin and exerting a downward and inward pressing directed force upon the pin so as to retain the IC package within the connector.

2. A terminal of an IC package connector for connecting an IC package having a plurality of pins to a printed circuit board (PCB), the connector having a plurality of slots each including a securing groove formed thereon and each of which receives one said terminal, the terminal being formed by bending a conducting strip into substantially four portions comprising:

a securing portion adapted to be secured within the securing groove of an associated slot;

a mounting portion extending from the securing portion and adapted to be positioned at a bottom of said slot for attachment to the PCB by using a surface mounting technique;

a first contact portion extending upwards and backwards from, and positioned over, said mounting portions, and adapted to contact one of the pins of the IC package at a first lower point; and a second contact portion extending generally upwards from said first contact portion with a slightly inward inclination and adapted to contact the pin of the IC package at a second upper point for exerting a downward and inward directed force upon the pin so as to retain the IC package within the connector.

* * * * *